United States Patent [19]

Hansen

[11] Patent Number: 4,905,144

[45] Date of Patent: Feb. 27, 1990

[54] HIGH SPEED PATH OPTIMIZATION CO-PROCESSOR

[75] Inventor: John M. Hansen, Livermore, Calif.

[73] Assignee: FMC Corporation, Chicago, Ill.

[21] Appl. No.: 116,804

[22] Filed: Nov. 2, 1987

[51] Int. Cl.[4] .............................................. G06F 15/46
[52] U.S. Cl. ..................................... 364/200; 364/148
[58] Field of Search ............... 364/148, 153, 554, 423, 364/402, 200 MS File, 900 MS File

[56] References Cited

U.S. PATENT DOCUMENTS

| | | | |
|---|---|---|---|
| 3,974,481 | 8/1976 | Ledieu et al. | 364/153 |
| 4,174,514 | 11/1979 | Sternberg | 364/200 |
| 4,210,962 | 7/1980 | Marsh et al. | 364/900 |
| 4,534,009 | 8/1985 | McGee | 364/900 |
| 4,574,394 | 3/1986 | Holsztynski | 364/200 |

OTHER PUBLICATIONS

P. A. Gilmore, "Structuring of Parallel Algorithms", Journal of the Assoc. for Computing Machinery, vol. 15, No. 2, Apr. 1968, pp. 176–192.

Primary Examiner—Gareth D. Shaw
Assistant Examiner—Debra A. Chun
Attorney, Agent, or Firm—Lloyd B. Guernsey; R. C. Kamp; R. B. Megley

[57] ABSTRACT

A data processor having a pipeline-parallel structure for rapidly solving optimization problems using relatively simple circuitry. A plurality of pipelines each have a circuit for adding a directional cost value to a directional sum value and the total value compared to an adjacent sum value to obtain an optimum value. The optimum result of each comparison in the pipelines is coupled to a processor control circuit. The process is repeated until an optimum path value is obtained.

9 Claims, 5 Drawing Sheets

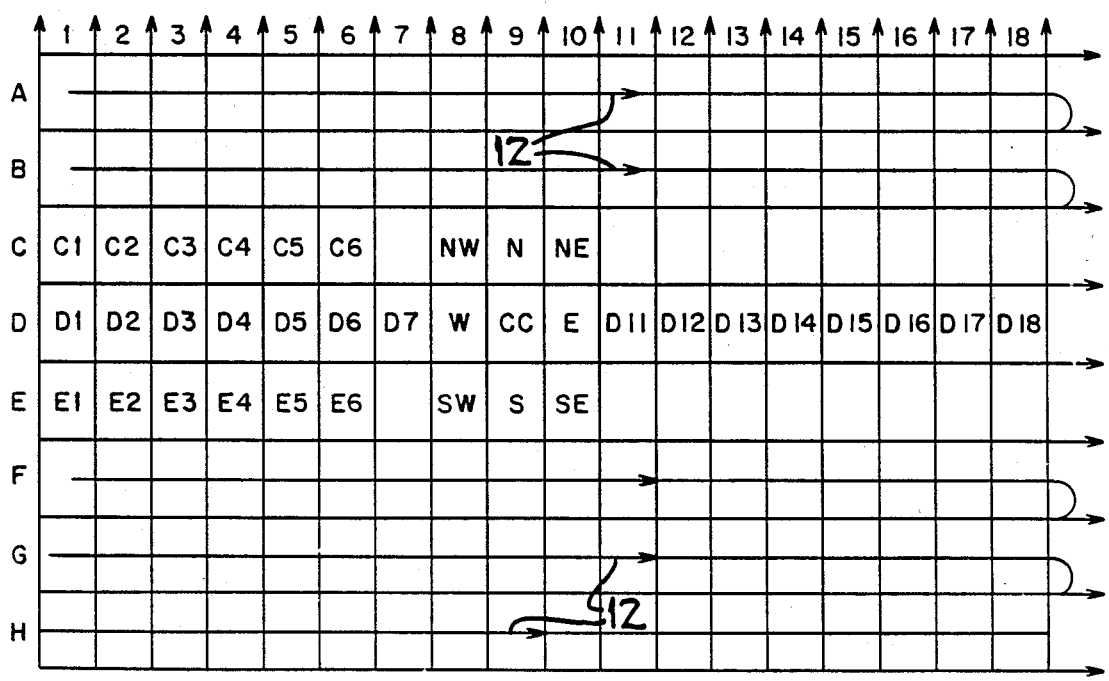

FIG_2A 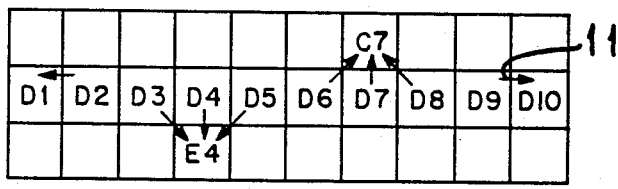
FIG_2B 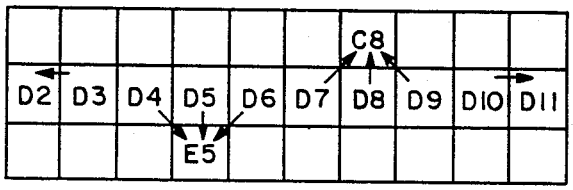
FIG_2C 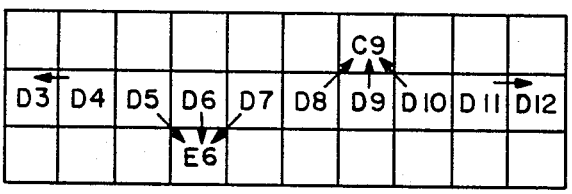
FIG_2D 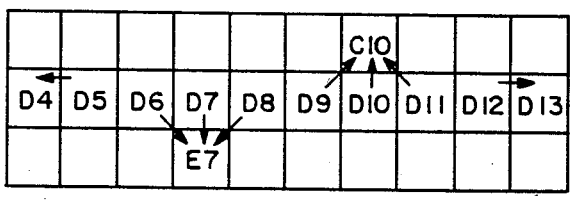
FIG_2E 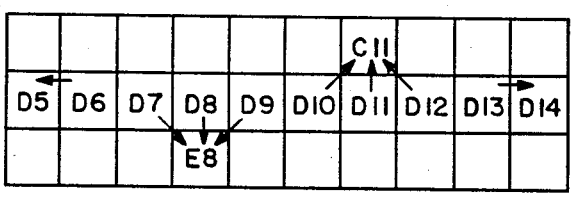
FIG_2F 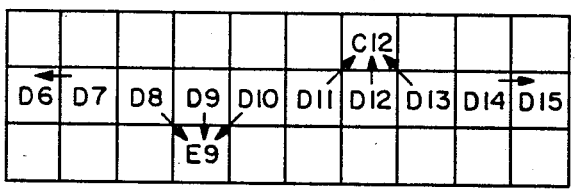
FIG_2G 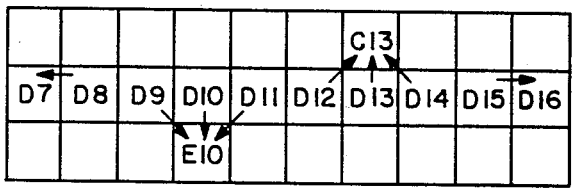
FIG_2H 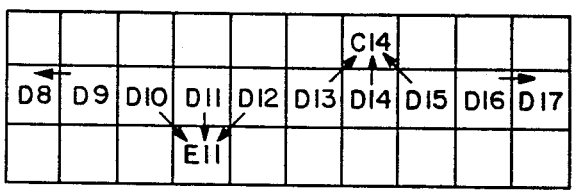

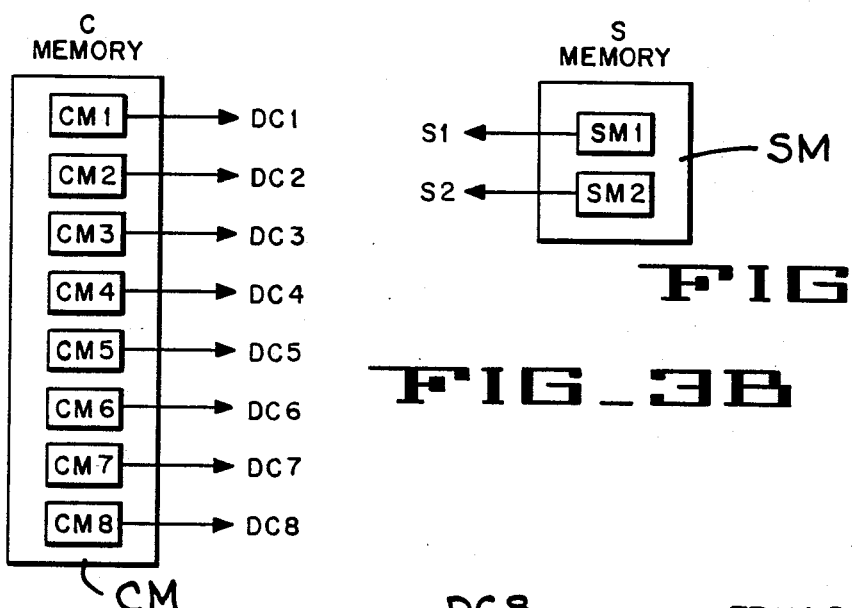
FIG_3A
FIG_3B
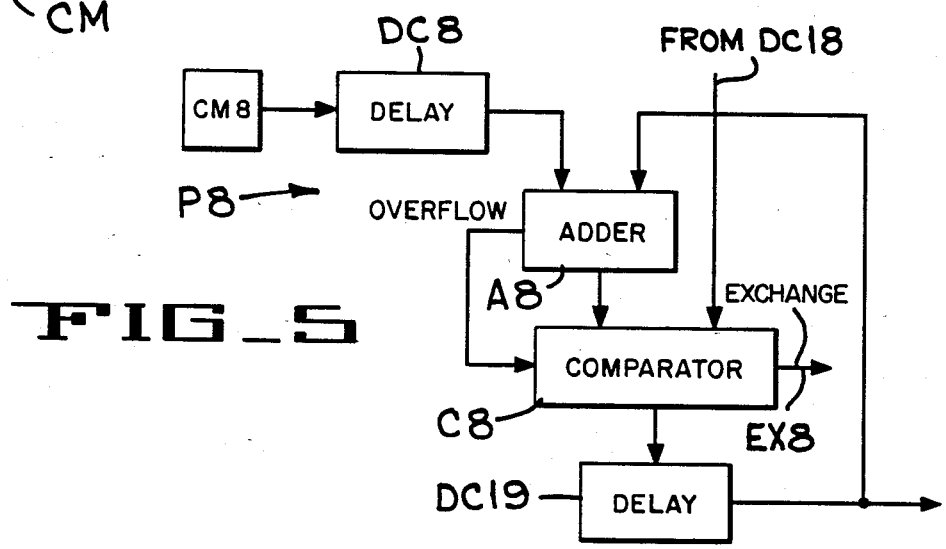
FIG_5
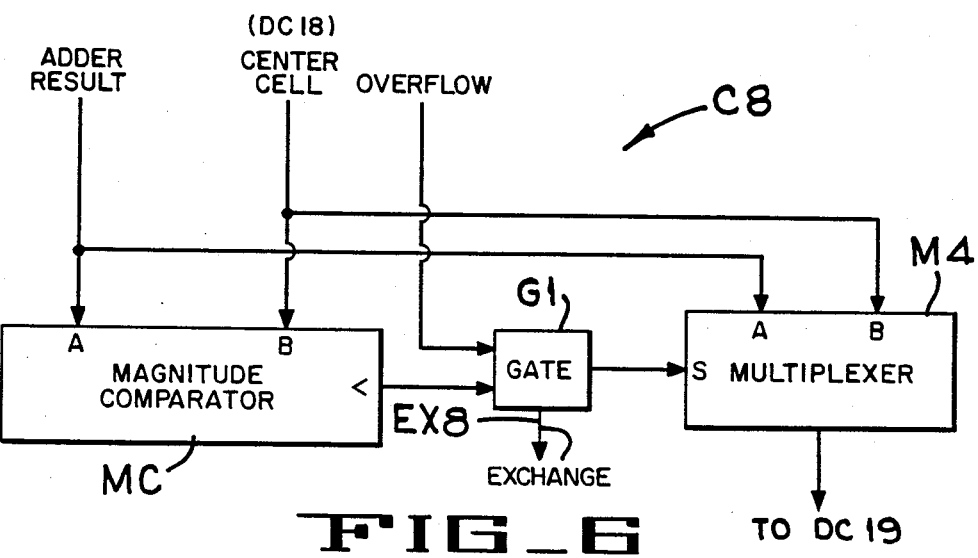
FIG_6

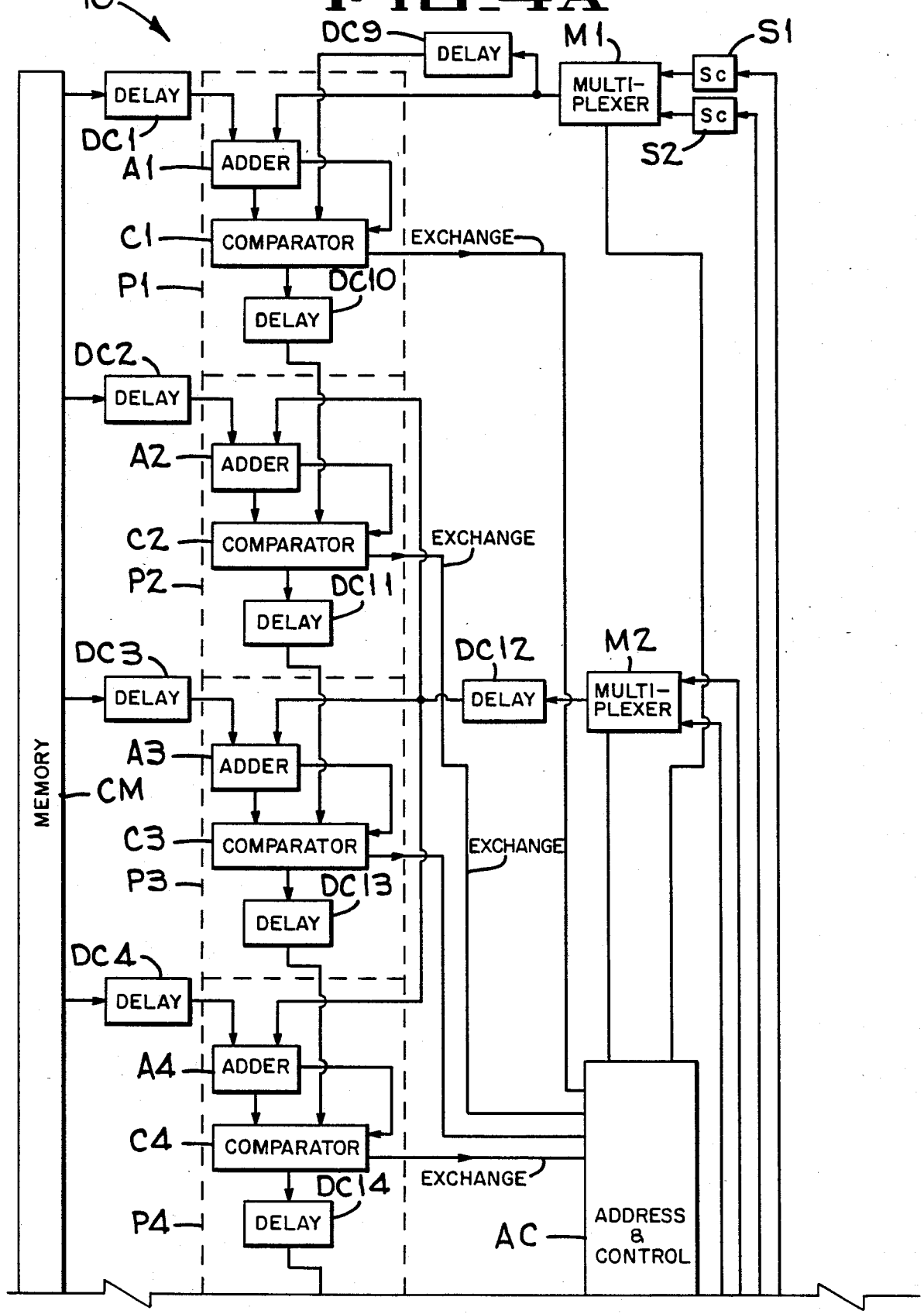
FIG_4A

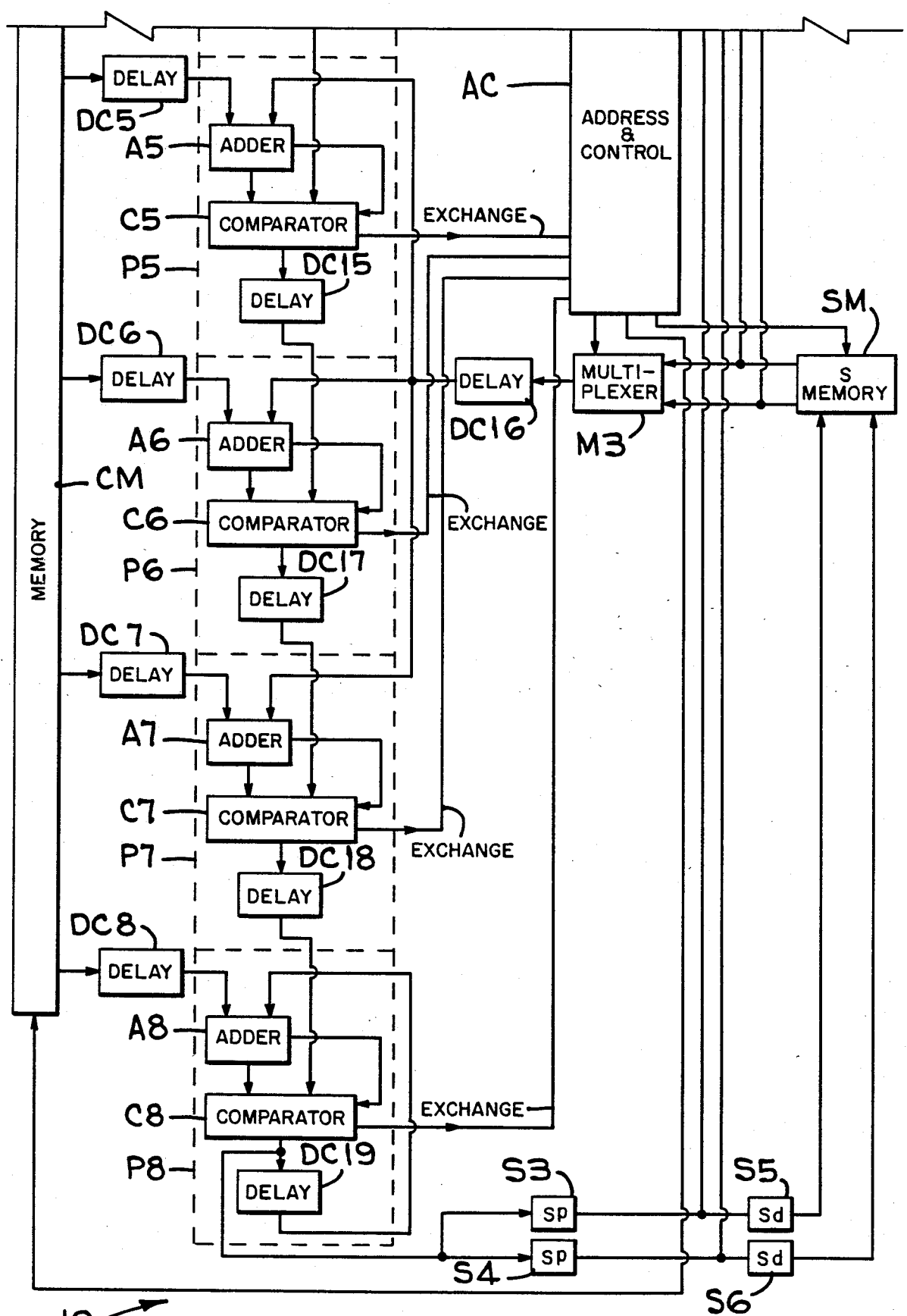
FIG_4B

HIGH SPEED PATH OPTIMIZATION CO-PROCESSOR

BACKGROUND OF THE INVENTION

The present invention relates to data processors, and more particularly, to a data processor having a pipeline-parallel structure to rapidly solve optimization problems.

Dynamic programming provides a sequential decision-making method of solving optimization problems. Plotting the path of a military tank from one position on a battlefield to another position while considering the terrain, amount of concealment, available roads, enemy movement, fuel consumption, etc. is one practical application of dynamic programming. Dynamic programming converts a comparison of the many overall choices to select the optimum choice into a sequential comparison of much simpler intermediate optimization problems. When plotting tank movement, the space (state space) through which the tank can travel is divided into a plurality of space areas or cells. The optimum transition from one cell to each of the adjacent cells closer to the final position is then calculated. The optimum path may be determined by all, or only a part of the factors which can be considered, depending upon choices made by a human operator or director.

The candidate optimum transitions of the tank from each and every one of the cells in the state space between the starting and ending points are compared, and these optimum transitions are used to calculate the overall optimum path between starting and ending points. It is often more efficient to start calculations at the cell containing the ending point and perform the dynamic programming calculations in reverse toward the starting point.

In order for dynamic programming to be useful in solving problems in real-time, solutions must be obtained very rapidly. For example, when plotting an optimum path for a military tank, if a solution is obtained at a slow rate the tank could change its position so fast that the solution would not be optimum by the time a first portion of the solution is obtained.

One method of rapidly obtaining an optimum path is to assign values to the cost of moving outward from the end-point cell in each direction to adjacent cells and use these values to calculate the lowest cost to reach a starting-point cell. The cost of moving from the end-point cell to each of the 8 adjacent cells is simultaneously calculated and the lowest cell is selected by a comparator circuit having 8 inputs. This process is repeated until the desired starting-point cell is reached.

SUMMARY OF THE INVENTION

The present invention discloses a processor for rapidly solving dynamic programming problems using relatively simple circuitry. The processor includes a plurality of pipeline stages each having a circuit for adding a directional cost value to a directional sum value and comparing the result with a center cell sum value to obtain an optimum value. The results of each of the comparisons in the pipeline stages is coupled to a processor control circuit. In the first pipeline stage, the center cell sum value is obtained from a memory source of sum values. In the remainder of the pipeline stages the optimum value from an adjacent pipeline stage is used as the center cell sum value.

BRIEF DESCRIPTION OF THE DRAWINGS

FIG. 1A–1C are are state space maps illustrating the process of determining optimum transition from a plurality of space cells to a final cell.

FIG. 1D is an illustration of the costs to travel in any one of several directions on a state space map of the type shown in FIG. 1A–1C.

FIG. 2 illustrates an array of cells which represents a state map and shows a preferred method of scanning the array of cells.

FIGS. 2A–2H each show a plurality of cost calculations which are made simultaneously to increase the speed of operation.

FIG. 3A is a block diagram of a directional cost memory of a data processor used to solve dynamic programming problems.

FIG. 3B is a block diagram of a sum memory of a data processor used to solve dynamic programming problems.

FIGS. 4A, 4B from a block diagram of a basic processor used in dynamic programming.

FIG. 5 is a block diagram disclosing details of the processor of FIGS. 4A, 4B.

FIG. 6 is a block diagram disclosing details of the processor of FIGS. 4A, 4B.

DESCRIPTION OF THE PREFERRED EMBODIMENT

Dynamic programming is especially useful for solving optimization problems where either a minimum or a maximum value is to be obtained. Dynamic programming converts the simultaneous determinations of an overall optimization into a plurality of sequential solutions of simpler intermediate optimization problems. Each of the intermediate solutions affects solutions made later in the problem, but the overall solution to the problem is the same as would be obtained if all the possible transitions were checked and the optimum combination selected. The time required to obtain an overall solution to the problem is greatly reduced by using dynamic programming.

In dynamic programming, the overall problem is divided into "stages" of a "state space" sometimes called "dimensions". The state space is divided into a plurality of adjacent "cells" or stages which may or may not represent geometric dimensions. Generally the goal is to advance from a state space cell in one stage to a state space cell in another stage until the cell in the stage and state space which represents the final solution is reached. The goal in each transition from one stage to another stage is to achieve the optimum transition.

Dynamic programming problems are divided into stages with each stage having a number of states or stage space cells. A policy decision is required at each stage with the policy decision transforming the current state of each stage into a state associated with the next stage. The optimum policy decisions for the remaining stages is independent of the policy adopted in the previous stages. The solution procedure can be begun by finding the optimum policy for each state at either the last stage or at the beginning stage. A recursive problem can be used which identifies the optimum policy for each state space with a specific number of stages remaining when the optimum policy for each stage and the remaining number of stages are known. The solution proceeds from stage to stage until the optimum overall decision is reached.

An illustration of simple graphic dynamic programming is shown in FIGS. 1A–1C. A grid pattern represents an area of land wherein a mobile vehicle can travel to the space at the right where the arrows converge on the numeral "0" in cell H. The area is made up of four stages, with each stage being made up of four states. The "cost" of moving from any state space cell to the final cell is given by the numeral in that space cell, and the direction of the route is indicated by the arrows. The cost to go through each cell may be determined by the presence of roads or the lack of roads in the cell, by hills, valleys and other factors.

The total cost includes the actual physical transition of a vehicle from one state space cell to another and may also include data which defines one or more variables associated with a state space cell being checked.

The first step is to calculate the cost of transition to state space cell H from each of the adjacent states or cells using the directional costs shown in FIG. 1D. The numerals in FIG. 1D indicate the cost to move from one cell to an adjacent cell in the direction indicated by the arrows immediately to the left of each numeral. Using the numerals in FIG. 1D it costs 7 units to go from cell C (FIG. 1B) to cell H; 4 units to go from cell G to cell H, 2 units to go from cell L to cell H. It costs 2 units to go from cell F to cell C and 7 units to go from cell C to cell H (FIG. 1B), so the total from cell F to cell H as shown by the arrows in FIG. 1B is 9 units. It costs an additional 2 units to go from cell J to cell F so a total cost from cell J, through cells F, C to H is 11 units. Going a different route from cell J through cells F, G to H costs only 10 units as seen in FIG. 1C.

A typical solution to a cost problem includes checking the cost from any one cell, such as from cell J to cell H over each of the several paths between cell J and cell H, and choosing the path having the smallest total cost. The procedure may include initially setting the cost of each cell to a large value as shown in FIG. 1A and systemically replacing each large cell value by a corresponding directional cost value from FIG. 1D as a computer program checks costs over a plurality of paths. The first step is to check the cost from cell H to each of the adjacent cells and choose the adjacent cell having the lowest cost. Then check the cost from the first chosen adjacent cell to each cell adjacent to the first cell. This process is repeated until a starting point cell, such as cell J, is reached.

To determine the optimum transition from any given state space cell at a given stage to the next stage using reverse dynamic programming, transitions to all adjacent cells in the next stage must be checked. This is illustrated in FIG. 2 where each of the cells, N, NE, E, SE, S, SW, W, NW surrounding the center cell must be checked. Each of the allowable state space cells of FIG. 2 has one variable associated with the cell which is periodically updated.

The present invention enables a plurality of cells to be simultaneously considered to be center cells and the cost of moving from each of these center cells to an adjacent cell to be determined. A sweeping process as represented by the arrows of FIG. 2 is used to cover the total cost map to a final solution. The sweep scans over the total cost map so that every cell is operated on once each sweep. When the sweep scans row D of FIG. 2, each of the cells is sequentially considered to be a center cell and the cost to an adjacent cell is determined. A circuit which controls the sweep over the total cost map and rapidly determines the optimum transition path is disclosed in FIGS. 4A, 4B. When the FIGS. 4A, 4B are placed adjacent to each other so the lines from the lower portion of FIG. 4A extend to the lines from the upper portion of FIG. 4B, a complete processor 10 for dynamic programming is disclosed.

An address and control circuit AC )FIGS. 4A, 4B) controls operation of the processor by directing data from a cost memory CM and a sum memory SM to various portions of the processor. The values stored in memory CM are the directional cost from each cell to each of its neighbor cells. The values stored in memory SM are the optimal combination of the various directional costs from a final goal point cell to any given point cell. As the processor 10 scans each of the rows of the state space map (FIG. 2) cost values are retrieved from cost memory CM and directed to a plurality of pipeline stages P1–P8 where 8 sum values are each simultaneously compared with a corresponding sum value from an adjacent cell. The lowest value of each sum pair is selected and stored for use in determining the optimum cost path. This simultaneous comparison and selection by processor 10 provides a rapid solution of a optimization problem.

The operation of processor 10 can be seen by observing the flow of signals as the processor scans along row D of the state space map of FIG. 2. The scanning process stops at each column in the row and calculates the cost of moving from a center cell in row D to an adjacent cell. A similar scanning and calculating process occurs at different times in each of the other rows of the map. FIG. 2 illustrates the relationship of the center cell CC to a plurality of adjacent cells when the scanning process reaches a position where the center cell CC is in column 9 of row D. At this time the cost of moving from cell CC to an East cell E is checked by retrieving the East cost from memory CM (FIGS. 4A, 4B) and coupling the East cost signal through a delay circuit DC1 to an adder A1 in a pipeline stage P1. At the same time the East sum value which was previously retrieved from a total cost memory SM is directed to adder A1 through a storage unit S1 and a multiplexer M1. Adder A1 provides a new East total which is the sum of, the cost of moving from cell CC to cell E (East cost) and the previous optimal sum associated with cell E (East sum). This East total is coupled to a comparator C1 where the East total is compared with the output value of cell CC and the smaller value of East total and CC output is sent to a delay circuit DC10 for storage.

The comparison process can be seen by taking "snapshots" of the operation at several different instances of time and observing operation of the circuit of FIGS. 4A, 4B at those times. As the scanning moves from left to right along the row D (FIG. 2) the operation of the circuit of FIGS. 4A, 4B progresses from the operation shown in FIG. 2A to the operation shown in FIG. 2B, sequentially through the operation shown in FIG. 2H.

During the time shown in FIG. 2A cell D9 determines the cost to an E cell (D10) as indicated by an arrow 11 using a pipeline stage P1 to compare costs. At the same time cell D8 determines the cost to a NW cell (C7) in a pipeline stage P2 (FIG. 4A), cell D7 determines the cost to its N cell (C7) in a pipeline stage P3, and cell D6 determines the cost to its NE cell (C7) in a pipeline stage P4. Cell D5 determines the cost to its SE cell (E4) in a pipeline stage P5 (FIG. 4B), cell D4 determines the cost to its S cell (E4) in a pipeline stage P6, and cell D3 determines the cost to its SE cell (E4) in a pipeline stage P7. Cell D2 determines the cost to its W cell (D1) in a pipeline stage P8.

Details of how these cost comparisons are made can be seen in the circuit of FIGS. 4A, 4B. The D9 sum value signal from memory SM is coupled to a storage unit S1 and through a multiplexer M1 to a one time unit delay circuit DC9. The D10 signal (E sum value) from memory SM is coupled through a storage unit S1 and multiplexer M1 to an adder A1. The E cost is coupled from memory CM through a one time unit delay circuit DC1 to adder A1 where the E cost and the E sum values are added and a resultant E total is compared in a comparator C1 with signal value D9 from delay circuit DC9. The smaller value of signal D9 and E total is coupled from comparator C1 and stored in a one time unit delay circuit DC10 for use during the next cycle of comparison. At the same time, a C7 sum signal from storage unit S4 (FIG. 4B) is routed through a multiplier M2 and a three time unit delay circuit DC12 to pipelines stages P2, P3, P4 and to storage unit S6. The C7 sum value from delay circuit DC12 and a NW cost, delayed two units in time by delay circuit DC2, are added in an adder A2 and the NW total is compared in comparator C2 with a D8 signal value previously stored in delay circuit DC10. The smaller value of signal D8 and the NW total is stored in a delay circuit DC11 for use in the next cycle of comparison which is the time shown in FIG. 2B. The C7 sum value from delay circuit DC12 and a N cost, delayed three units in time by delay circuit DC3, are added in an adder A3 and a N total compared in comparator C3 with a D7 signal value previously stored in delay circuit DC11. The smaller value of signal D7 and N total is stored in a delay circuit DC13 for use in the next cycle. The C7 sum value from delay circuit DC12 and a NE cost, delayed four times unit by delay circuit DC4, are added in an adder A4 and a NE total compared in comparator C4 which a D6 signal value previously stored in delay circuit DC13. The smaller value of signal D6 and NE total is stored in a delay circuit DC14 for use in the next cycle.

At this same time (FIG. 2A) an E4 sum value from memory SM (4B), coupled through a multiplexer M3 and a five time unit delay circuit DC16 is applied to pipeline stages P5, P6, P7, and to storage unit S2. The E4 sum value from delay circuit DC16 and a SW cost from memory CM, delayed five units in time by delay circuit DC5 are added in adder A5 and the SW total compared in a comparator C5 with a D5 signal value previously stored in delay circuit DC14. The smaller value of signal D5 and SW total is stored in a delay circuit DC15 for use in the next cycle. The E4 sum value from delay circuit DC16 and a S cost from memory CM, delayed six units in time by delay circuit DC6 are added in adder A6 and the S total is compared in a comparator C6 with a D4 signal value previously stored in delay circuit DC15. The smaller value of signal D4 and the S total is stored in a delay circuit DC17 for use in the next cycle. The E4 sum value from delay circuit DC16 and SE cost from memory CM, delayed seven time units by delay circuit DC7 are added in adder A7 and the SE total compared in a comparator C7 with a D3 signal value previously stored in delay circuit DC17. The smaller value of signal D3 and SE total is stored in a delay circuit DC18 for use in the next cycle. A D1 sum from delay circuit DC19 and a W cost from memory CM, delayed eight time units by delay circuit DC8 are added in adder A8 and the W total compared in a comparator C8 with a D2 value previously stored in delay circuit DC18. The smaller value from comparator C8 is stored in delay circuit DC19 for use in the next cycle, and is placed in storage unit S3 for use in the scan of the next row. At the same time, the C9 sum value previously stored in storage unit S5 is stored in memory SM (FIG. 4B).

During the next cycle of operation, the circuit of FIGS. 4A, 4B performs the eight sets of comparisons shown by the arrows in FIG. 2B. Cell D10 determines the cost to an E cell (D11) using the D10 signal from memory SM through storage unit S1, multiplexer M1, and delay circuit DC9 to pipeline stage P1. The D11 signal (E sum value) from multiplexer M1 and the E cost from memory CM and delay circuit DC1 are also applied to pipeline stage P1 and the total E value compared with the value of signal D10. The C8 sum signal from storage unit S4, multiplexer M2 and delay circuit DC12 is applied to pipeline stages P2, P3, P4. The C8 sum and a NW cost from delay DC2 are added and compared to a D9 signal from DC10 in pipeline stage P1; the C8 sum and a N cost from delay circuit DC3 are added and compared to a D8 signal from DC11 in pipeline stage P2; and the C8 sum and a NE cost from delay circuit DC4 are added and compared to a D7 signal from DC13 in pipeline stage P3 as described above. The E5 sum signal from memory SM, multiplexer M3 and delay circuit DC16 is applied to pipeline stages P5, P6, P7. The E5 sum and a SW cost from delay circuit DC5 are added and compared to a D6 signal from DC14 of pipeline stage P4 pipeline stage P5; the E5 sum and a S cost from delay circuit DC6 are added and compared to a D5 signal from DC15 of pipeline stage P5; and a S5 sum and a SE cost from delay circuit DC7 are added and compared to a D4 signal from DC17 of pipeline stage P6 in pipeline stage 7. A D2 sum signal from delay circuit DC19 and a W cost signal from delay circuit DC8 and a W total is compared with a D3 value stored in delay circuit DC18. The C10 sum value previously stored in storage unit S5 is moved into memory SM for storage.

The circuit of FIGS. 4A, 4B continues to scan along row D (FIG. 2) making eight separate comparison checks at each of the positions of the center cell CC. Some of the comparison checks are shown in FIGS. 2C-2H. The same type of comparison checks are made at each position in the other rows and columns of FIG. 2 until the entire map has been scanned. When row D is being scanned, data is read from storage units S1, S4 and S5 while other data is written into storage units S2, S3 and S6. When row E is being scanned, data is read from storage units S2, S3 and S6 and data is written into storage units S1, S4 and S5. Multiplexers M1, M2 and M3 read data from the proper storage units in response to control signals from address and control circuit AC. The reading of data from one set of storage units while writing data into another set of storage units increases the operating speed of the circuit of FIG. 4A, 4B.

The circuit of FIGS. 4A, 4B is designed to allow a variety of types of scanning of rows and columns of the map of FIG. 2. Scanning can be from left to right along each row as shown by the scanning arrows 12, or scanning can be from right to left along each row. Another scanning pattern can be from left to right along a row A, and right to left along row B, etc. in an alternating pattern. Scanning can be from top to bottom of columns 1–18 or from bottom to top of each column. Scanning can also be from top to bottom of column 1, and bottom to top of column 2, etc. in an alternating pattern. The scanning pattern is controlled by address and control circuit AC.

Basic details of memories CM and SM of FIGS. 4A, 4B are disclosed in FIGS. 3A and 3B. Memory CM includes a plurality of storage elements CM1–CM8 which supplies data in parallel to delay circuits DC1–DC8 (FIGS. 4A, 4B). Memory SM includes a pair of storage areas SM1, SM2 which provide data to and receive data from portions of the circuit of FIGS. 4A, 4B. At one time data is read from area SM1 while other data is written into area SM2. Then data is read from area SM2 while data is written into area SM1.

Details of the operation of the pipeline stages P1–P8 can be seen by referring to the circuit of pipeline stage P8 as disclosed in FIGS. 5 and 6. A W cost signal from storage element CM8 and a sum signal from delay circuit DC19 are added in adder A8. If adder A8 does not produce an overflow signal, i.e., the result of adding the two signals in adder A8 does not have more bits than it can accommodate, the output signal from adder A8 is compared to the signal from delay circuit DC18. The smaller of the two signals is selected by comparator C8 and transferred to delay circuit DC19. When the W cost signal and the sum signal cause adder A8 to produce an overflow signal, the overflow signal causes comparator C8 to transfer the signal from delay circuit DC18 directly to delay circuit DC19.

Comparator C8 includes (FIG. 6) a magnitude comparator MC which compares the magnitude of signal at input terminals A and B. If signal A is less than signal B and if there is no overflow signal to a gate G1, a signal from comparator MC coupled through gate G1 causes a multiplexer M4 to select signal A. If signal B is less than or equal to signal A or if there is an overflow signal to gate G1, gate G1 is open and an absence of a signal to input terminal S of multiplexer M4 causes M4 to select signal B from DC18.

If comparator C8 (FIG. 5) selects the sum value from adder A8 for routing to delay circuit DC19, then an exchange flag EX8 is set to a 1, otherwise the flag EX8 is set to 0. The exchange flag is used by address and control circuit AC to determine when the final solution is achieved. If no exchange flag EX8 of 1 is set during scan operations for one entire pass through all the cells, then the final answer has been obtained. The scanning process is continued until no exchanges are detected by address and control circuit AC for one complete pass. The exchange flag EX8 is routed from the output of gate G1 (FIG. 6) to the address and control circuit AC.

The operation of the circuit of FIGS. 4A, 4B has been described wherein each of the pipeline stages P1–P8 selects the smaller signal from a center cell signal and an adder signal. It should be understood that the same circuit could also select the larger of the two signals under the direction of address and control circuit AC.

Although the best mode contemplated for carrying out the present invention has been herein shown and described, it will be apparent that modification and variation may be made without departing from what may be regarded to be the subject matter of the invention.

What is claimed is:

1. A data processor having a pipeline-parallel structure for rapid solving optimization problems for use with a plurality of sequentially numbered sources of directional cost values, a plurality of sources of directional sum values, and a source of center cell values, said processor comprising:

a plurality of sequentially numbered pipeline stages, each of said pipeline stages having first, second and third input leads and first and second output leads, each of said pipeline stages having means for adding signals on said first and second input leads to produce a total signal and having means for comparing said total signal with a center cell signal on said third input lead, each of said pipeline stages having means for selecting a smaller value of signal from said total signal and said center cell signal and coupling said smaller signal to said first output lead of said pipeline stage, each of said pipeline stages having means for developing an exchange signal to indicate the result of said comparing of said total signal and said center cell signal, said exchange signal being coupled to said second output lead of said pipeline stage;

means for coupling said first input lead of each of said sequentially numbered pipeline stages to a corresponding numbered one of said sources of directional cost values;

means for coupling said second input lead of each of said sequentially numbered pipeline stages to one of said sources of directional sum values;

means for coupling said third input lead of a first of said sequentially numbered pipeline stages to said source of center cell values;

means for coupling said third input lead of each of the remainder of said sequentially numbered pipeline stages to said first output lead of an adjacent lower numbered one of said pipeline stages;

control means for directing the flow of signals in said data processor, said control means being connected to each of said pipeline stages and to each of said sources of cost and sum values; and means for coupling said first output lead of a highest numbered pipeline stage to said source of center cell values, said exchange signals on said second output leads causing said control means to couple signals to said source of center cell values from said first output lead of said higher numbered pipeline stage.

2. A data processor as defined in claim 1 including means for providing a corresponding directional cost value to each of said first input leads of said pipeline stages at a single instant of time to cause said pipeline stages to simultaneously provide a smaller directional signal on said first output lead of each of said pipeline stages.

3. A data processor as defined in claim 1 including a plurality of multiplexers connected between said pipeline stages and said source of directional sum values to facilitate the transfer of signals from said source of directional sum values to said pipeline stages at the same time signals are transferred from said pipeline stages to said source of sum values.

4. A data processor as defined in claim 1 wherein said processor includes eight pipeline stages and means for simultaneously operating each of said pipeline stages as a center cell of a state space map and for simultaneously checking the cost of moving from each of said center cells to an adjacent cell.

5. A data processor as defined in claim 1 wherein all of said pipeline stages simultaneously operate as a plurality of center cells of a state space map with each of said pipeline stages simultaneously checking the cost of movement to an adjacent cell, and with each of said adjacent checked cells being located in a different direction from the direction of the cells checked by any of the remainder of said pipeline stages.

6. A data processor having a pipeline-parallel structure for rapid solving optimization problems for use with a plurality of sequentially numbered sources of directional cost values, a plurality of sources of directional sum values, and a source of center cell values, said processor comprising:
- a plurality of sequentially numbered pipeline stages, each of said pipeline stages having first, second and third input leads and first and second output leads, each of said pipeline stages having means for adding signals on said first and second input leads to produce a total signal and having means for comparing said total signal with a center cell signal on said third input lead, each of said pipeline stages having means for selecting a larger value of signal from said total signal and said center cell signal and coupling said larger signal to said first output lead of said pipeline stage, each of said pipeline stages having means for developing an exchange signal to indicate the result of said comparing of said total signal and said center cell signal, said exchange signal being coupled to said second output lead of said pipeline stage;
- means for coupling said first input lead of each of said sequentially numbered pipeline stages to a corresponding numbered one of said sources of directional cost values;
- means for coupling said second input lead of each of said sequentially numbered pipeline stages to one of said sources of directional sum values;
- means for coupling said third input lead of a first of said sequentially numbered pipeline stages to said source of center cell values;
- means for coupling said third input lead of each of the remainder of said sequentially numbered pipeline stages to said first output lead of an adjacent lower numbered one of said pipeline stages;
- control means for directing the flow of signals in said data processor, said control means being connected to each of said pipeline stages and to each of said sources of cost and sum values; and
- means for coupling said first output lead of a highest numbered pipeline stage to said source of center cell values, said exchange signals on said second output leads causing said control means to couple signals to said source of center cell values from said first output lead of said highest numbered pipeline stage.

7. A data processor as defined in claim 6 including means for providing a corresponding directional cost value to each of said first input leads of said pipeline stages at a single instant of time to cause said pipeline stages to simultaneously provide a larger directional signal on said first output lead of each of said pipeline stages.

8. A data processor as defined in claim 6 wherein said processor includes eight pipeline stages and means for simultaneously operating each of said pipeline stages as a center cell of a state space map and for simultaneously checking the cost of moving from each of said center cells to an adjacent cell.

9. A data processor as defined in claim 6 wherein all of said pipeline stages simultaneously operate as a plurality of center cells of a state space map with each of said pipeline stages simultaneously checking the coat of movement to an adjacent cell, and with each of said adjacent checked cells being located in a different direction from the direction of the cells checked by any of the remainder of said pipeline stages.

* * * * *